(12) United States Patent
Jang et al.

(10) Patent No.: US 9,729,108 B2
(45) Date of Patent: Aug. 8, 2017

(54) APPARATUS AND METHOD FOR ADJUSTING ENVELOPE SIGNAL DELAY IN ENVELOPE-TRACKING POWER AMPLIFIER

(71) Applicant: Electronics and Telecommunications Research Institute, Daejeon (KR)

(72) Inventors: Seung Hyun Jang, Daejeon (KR); Bong Hyuk Park, Daejeon (KR); Nam Sik Ryu, Daejeon (KR); Dong Seung Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/996,809

(22) Filed: Jan. 15, 2016

(65) Prior Publication Data

US 2016/0218679 A1   Jul. 28, 2016

(30) Foreign Application Priority Data

Jan. 28, 2015   (KR) .................. 10-2015-0013278

(51) Int. Cl.
*H03G 3/30* (2006.01)
*H03F 1/02* (2006.01)
(Continued)

(52) U.S. Cl.
CPC ............. *H03F 1/0222* (2013.01); *H03F 3/19* (2013.01); *H03F 3/245* (2013.01);
(Continued)

(58) Field of Classification Search
CPC .......... H03F 1/0222; H03F 3/19; H03F 3/245; H03F 3/30; H03F 1/0205; H03F 1/0227;
(Continued)

(56) References Cited

U.S. PATENT DOCUMENTS 7,808,313 B2 * 10/2010 Markowski ........... H03F 1/0227
330/136
8,686,792 B2 * 4/2014 Sukegawa ............. H03F 1/3205
330/127

(Continued)

FOREIGN PATENT DOCUMENTS

KR   10-2013-0102474 A   9/2013
KR   10-2014-0040156 A   4/2014

*Primary Examiner* — Khanh V Nguyen
(74) *Attorney, Agent, or Firm* — NSIP Law (57) ABSTRACT

Provided is an apparatus for adjusting an envelope signal delay in an envelope-tracking power amplifier. The apparatus includes: an envelope signal providing unit configured to provide an envelope signal; a variable negative group delay unit configured to adjust a group delay of the envelope signal received from the envelope signal providing unit and output the adjusted envelope signal; an envelope modulator configured to modulate the envelope signal outputted from the variable negative group delay unit; a group delay difference detecting unit configured to detect a group delay difference between the envelope signal which is outputted from the envelope signal providing unit and the envelope signal which is outputted from the envelope modulator; and a control signal generating unit configured to generate a control signal to control a group delay value of the variable negative group delay unit according to the group delay difference.

12 Claims, 10 Drawing Sheets

(51) Int. Cl.
*H03F 3/19* (2006.01)
*H03F 3/24* (2006.01)

(52) U.S. Cl.
CPC .. *H03F 2200/102* (2013.01); *H03F 2200/451* (2013.01); *H03G 3/30* (2013.01); *H03G 3/3005* (2013.01)

(58) Field of Classification Search
CPC ........ H03F 1/0238; H03F 1/32; H03F 1/3247; H03G 3/30; H03G 3/3005; H03G 3/20
USPC .................................................. 330/136, 280
See application file for complete search history.

(56) References Cited

U.S. PATENT DOCUMENTS

| | | | |
|---|---|---|---|
| 9,172,330 B2* | 10/2015 | Midya | .................... H03F 1/0222 |
| 9,362,868 B2* | 6/2016 | Al-Qaq | ................. H03F 1/3241 |
| 2009/0096499 A1 | 4/2009 | Kim | |
| 2009/0097591 A1 | 4/2009 | Kim | |
| 2012/0114029 A1 | 5/2012 | Ryu et al. | |
| 2012/0154036 A1 | 6/2012 | Oh et al. | |
| 2013/0235949 A1 | 9/2013 | Jeckeln | |
| 2015/0035606 A1 | 2/2015 | Bartram | |

* cited by examiner

APPARATUS AND METHOD FOR ADJUSTING ENVELOPE SIGNAL DELAY IN ENVELOPE-TRACKING POWER AMPLIFIER

CROSS-REFERENCE TO RELATED APPLICATION

This application is based on and claims the benefit of priority to Korean Patent Application No. 10-2015-0013278, filed on Jan. 28, 2015 in the Korean Intellectual Property Office, the disclosure of which is incorporated herein in its entirety by reference.

BACKGROUND OF THE INVENTION

Technical Field

The present invention relates to an apparatus and a method for adjusting an envelope signal delay in an envelope-tracking power amplifier, and more particularly, to a technology of the time synchronization between an input signal inputted to an envelope-tracking power amplifier and an envelope signal applied to a power supply unit of the envelope-tracking power amplifier.

Background

Recently, differently from a past Global System for Mobile Communications (GSM), a mobile communication system has been evolved to an Orthogonal Frequency Division Multiplexing (OFDM) based communication system that has amplitude which changes greatly. The OFDM based communication system, such as Worldwide Interoperability for Microwave Access (WiMAX) and Wireless Broadband Internet (WiBro), is widely used, including the recently spotlighted Long-Term Evolution (LTE).

However, an OFDM-based transmitter has a problem in that a power amplifier does not operate efficiently due to the characteristic of a high Peak to Average Power Ratio (PAPR). In order to overcome this problem, various transmission structures have been proposed, including an envelope-tracking power amplifier.

The envelope-tracking power amplifier may accomplish a high efficiency performance when a signal having a waveform similar to an envelope of an input signal of the power amplifier is applied to a power supply unit of the power amplifier to always operate the power amplifier in a saturation area.

However, when time synchronization between an envelope signal applied to the power supply unit of the envelope-tracking power amplifier and an envelope signal of an input signal inputted to the envelope-tracking power amplifier does not match properly, the non-linearity of an output of the power amplifier may be generated significantly to lower the quality of a signal and an adjacent channel leakage ratio (ACLR) may be deteriorated to make it difficult to transmit a wireless signal.

Figure 1:
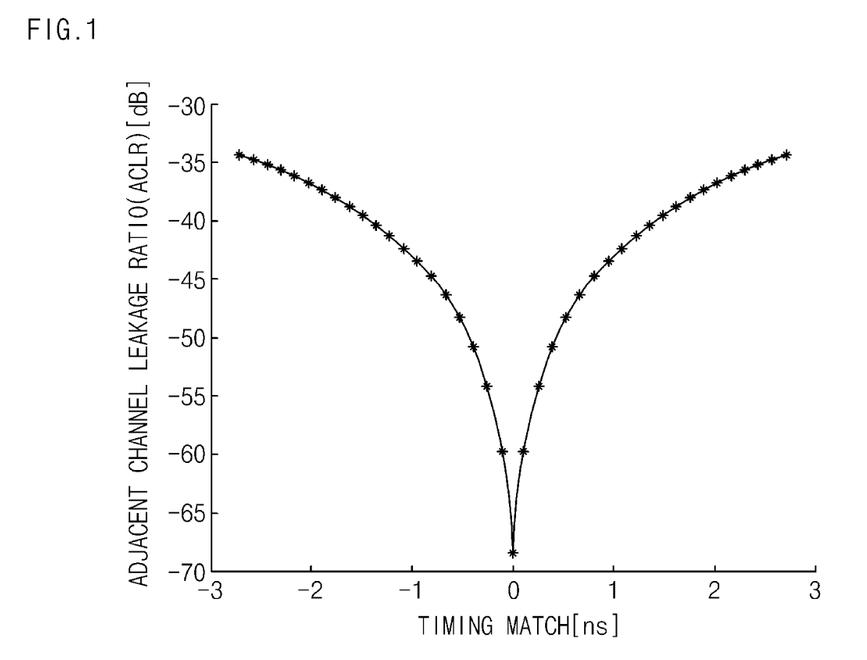
FIG. 1 is a diagram illustrating a relation between time synchronization between an envelope signal inputted to a normal envelope-tracking power amplifier and a signal applied to a power supply unit of the envelope-tracking power amplifier and an adjacent channel leakage ratio (ACLR)

FIG. 1 illustrates a simulation result of adjacent channel leakage ratio (ACLR) in accordance with a mismatched degree of time synchronization between an envelope signal applied to the power supply unit of the envelope-tracking power amplifier and an input signal inputted to the envelope-tracking power amplifier with respect to a signal of LTE 10 MHz having the characteristic of PAPR 8.7 dB. Referring to FIG. 1, it can be seen that the ACLR may be worse than −45 dB even if the time synchronization is deviated about 1 ns.

SUMMARY OF THE INVENTION

The present invention has been made in view of the above problems, and provides an apparatus and a method for matching the time synchronization between an input signal inputted to an envelope-tracking power amplifier and an envelope signal applied to a power supply unit of the envelope-tracking power amplifier.

In accordance with an aspect of the present invention, an apparatus for adjusting an envelope signal delay in an envelope-tracking power amplifier includes: an envelope signal providing unit configured to provide an envelope signal; a variable negative group delay unit configured to adjust a group delay of the envelope signal received from the envelope signal providing unit and output the adjusted envelope signal; an envelope modulator configured to modulate the envelope signal outputted from the variable negative group delay unit; a group delay difference detecting unit configured to detect a group delay difference between the envelope signal which is outputted from the envelope signal providing unit and the envelope signal which is outputted from the envelope modulator; and a control signal generating unit configured to generate a control signal to control a group delay value of the variable negative group delay unit according to the group delay difference. The apparatus further includes a power amplifier configured to amplify a power of an input signal, when the envelope signal which is outputted from the envelope modulator is applied to a power supply unit. The envelope signal providing unit includes: an extracting unit configured to extract an envelope signal from all or part of the input signal which is inputted to the power amplifier; and an envelope signal processing unit configured to process the extracted envelope signal. The variable negative group delay unit performs a group delay for the envelope signal outputted from the envelope signal providing unit so that time synchronization between the envelope signal which is outputted from the envelope modulator and the input signal is matched. The variable negative group delay unit performs a group delay for the envelope signal which is outputted from the envelope signal providing unit in order to compensate a time difference between the envelope signal which is outputted from the envelope signal providing unit and the envelope signal which is outputted from the envelope modulator. The apparatus further includes a modem configured to transmit the envelope signal. The apparatus further includes a group delay unit configured to perform a group delay for the envelope signal which is outputted from the envelope modulator to transmit to the group delay difference detecting unit.

In accordance with another aspect of the present invention, a method for adjusting an envelope signal delay in an envelope-tracking power amplifier includes: providing an envelope signal; performing a variable negative group delay for the envelope signal; modulating the group delayed envelope signal and applying to a power supply unit of a power amplifier configured to amplify a power of an input signal; detecting a group delay difference between the signal applied to the power supply unit of the power amplifier and the envelope signal; and performing the variable negative group delay for the envelope signal to the extent of the group delay difference. Providing an envelope signal includes extracting and processing all or part of the input signal and providing the envelope signal. Providing an envelope signal includes generating an envelope signal by a modem. The method further includes, before detecting a group delay difference, performing a group delay for the signal which is applied to the power supply unit of the power amplifier. Performing a variable negative group delay includes performing the variable negative group delay for the envelope signal so that time synchronization between the signal which is applied to the power supply unit of the power amplifier and the input signal which is inputted to the power amplifier is matched.

The present technology may minimize a difference of time delay between the input signal of the power amplifier and the envelope signal applied to the power supply unit of the power amplifier, thereby preventing the deterioration of the output signal of the power amplifier which is generated due to a time delay between the two signals.

Further, the present technology may minimize a difference of time delay between the input signal of the power amplifier and the envelope signal applied to the power supply unit of the power amplifier, thereby maintaining the adjacent channel leakage ratio in the output of the envelope-tracking power amplifier to be able to accomplish a wireless transmission of a signal.

BRIEF DESCRIPTION OF THE DRAWINGS

The objects, features and advantages of the present invention will be more apparent from the following detailed description in conjunction with the accompanying drawings, in which.

DETAILED DESCRIPTION OF EXEMPLARY EMBODIMENTS

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

The present invention relates to a technology of adjusting a delay of an envelope signal inputted to a power supply unit of an envelope-tracking (ET) power amplifier, and discloses a technology of detecting a delay difference between an envelope signal and the envelope signal applied to the power supply unit of the power amplifier and adjusting a delay of the envelope signal inputted according to the delay difference.

Hereinafter, embodiments of the present invention are described in detail with reference to FIG. 2 to FIG. 8B.

Figure 2:
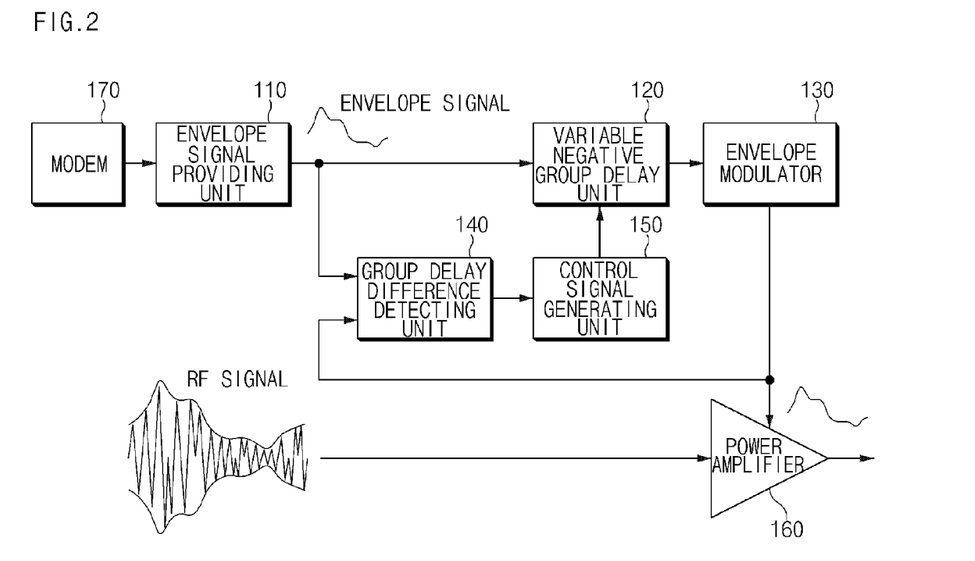
FIG. 2 is a diagram illustrating a configuration of an apparatus for adjusting an envelope signal delay in an envelope-tracking power amplifier according to a first embodiment of the present invention.

FIG. 2 is a diagram illustrating a configuration of an apparatus for adjusting an envelope signal delay in an envelope-tracking power amplifier according to a first embodiment of the present invention.

The apparatus for adjusting an envelope signal delay in an envelope-tracking power amplifier according to a first embodiment of the present invention may include a modem 170, an envelope signal providing unit 110, a variable negative group delay unit 120, an envelope modulator 130, a group delay difference detecting unit 140, a control signal generating unit 150, and a power amplifier 160. The modem 170 may generate and output an envelope signal.

The envelope signal providing unit 110 may transmit an envelope signal received from the modem 170 to the variable negative group delay unit 120.

The variable negative group delay unit 120 may receive and output the envelope signal outputted from the envelope signal providing unit 110 after adjusting a group delay of the envelope signal. A variable group delay amount of the variable negative group delay unit 120 may be determined by a signal outputted from the control signal generating unit 150.

The envelope modulator 130 may receive the envelope signal which is group delay adjusted through the variable negative group delay unit 120, and modulate the group delay adjusted-envelope signal into a signal having a large power and output the modulated signal. At this time, the envelope modulator 130 may apply a modulated envelope signal to the power supply unit of the power amplifier 160.

The group delay difference detecting unit 140 may receive the envelope signal outputted from the envelope signal providing unit 110 and the envelope signal which is outputted from the envelope modulator 130 and is applied to the power supply unit of the power amplifier 160, and detect a group delay difference between the two signals and output an error signal representing the difference.

When receiving the error signal outputted from the group delay difference detecting unit 140, the control signal generating unit 150 may output a control signal for adjusting the group delay of the variable negative group delay unit corresponding to the error signal. That is, the control signal generating unit 150 may output a control signal which is able to delay the envelope signal outputted from the envelope signal providing unit 110 for a delay time between the envelope signal outputted from the envelope signal providing unit 110 and the envelope signal outputted from the envelope modulator 130 and compensate the group delay difference. Accordingly, the variable negative group delay unit 120 may delay the envelope signal by the control signal outputted from the control signal generating unit 150, so that the time synchronization between the envelope signal outputted from the envelope signal providing unit 110 and the envelope signal outputted from the envelope modulator 130 is matched.

The power amplifier 160 may amplify the power of an RF input signal when the envelope signal outputted from the envelope modulator 130 is applied to the power supply unit. In this case, only when the time synchronization between the envelope signal applied to the power supply unit and the RF input signal is matched, the adjacent channel leakage ratio (ACLR) may be enhanced.

Figure 3:
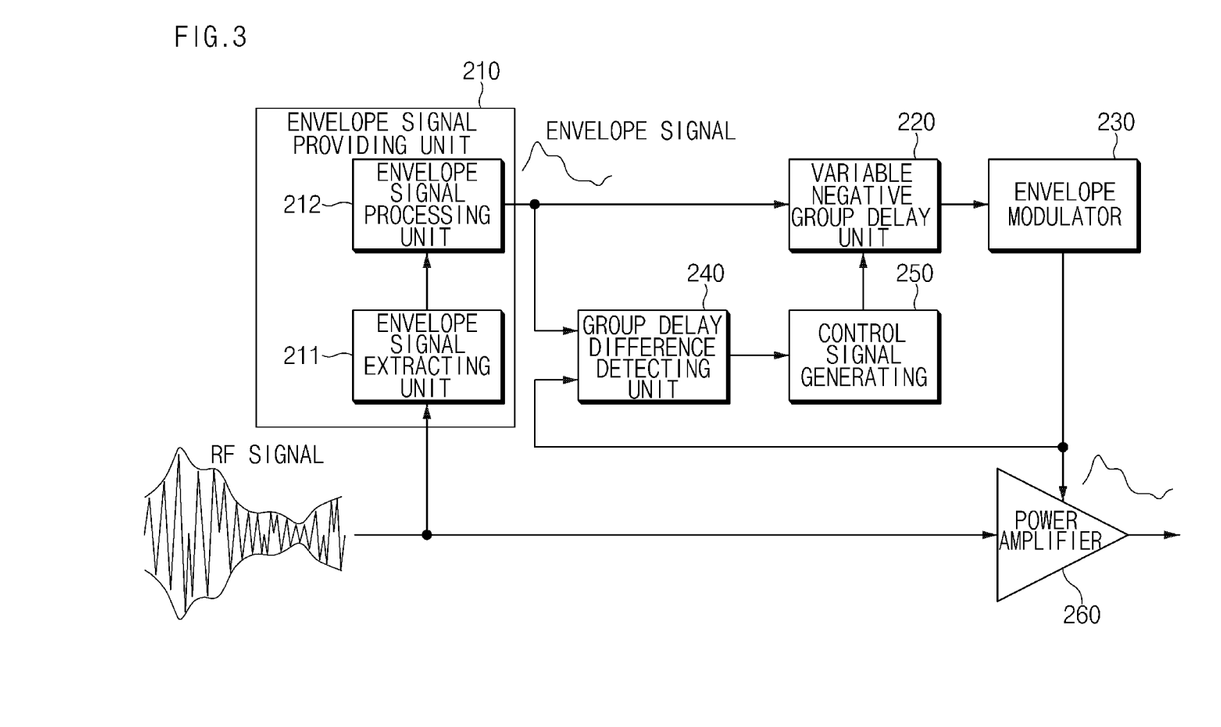
FIG. 3 is a diagram illustrating a configuration of an apparatus for adjusting an envelope signal delay in an envelope-tracking power amplifier according to a second embodiment of the present invention.

FIG. 3 is a diagram illustrating a configuration of an apparatus for adjusting an envelope signal delay in an envelope-tracking power amplifier according to a second embodiment of the present invention.

The second embodiment of the present invention is different from the first embodiment of the present invention in that the modem 170 does not generate an envelope signal as shown in FIG. 2, but an envelope signal providing unit 210 generates an envelope signal by using an RF input signal inputted to the power amplifier 160.

That is, since the remaining elements of the second embodiment of the present invention including a variable negative group delay unit 220, an envelope modulator 230, a group delay difference detecting unit 240, a control signal generating unit 250, and a power amplifier 260 are substantially identical with the variable negative group delay unit 120, the envelope modulator 130, the group delay difference detecting unit 140, the control signal generating unit 150, and the power amplifier 160 of the first embodiment of the present invention, a detailed description thereof is omitted.

The envelope signal providing unit 210 of the second embodiment of the invention may process all or part of an RF input signal inputted to the power amplifier 160 to generate an envelope signal. To this end, the envelope signal providing unit 210 may be provided with an envelope signal extracting unit 211 and an envelope signal processing unit 212.

The envelope signal extracting unit 211 may extract all or part of the RF input signal inputted to the power amplifier 260.

The envelope signal processing unit 212 may process all or part of the envelope signal extracted from the envelope signal extracting unit 211.

Figure 4:
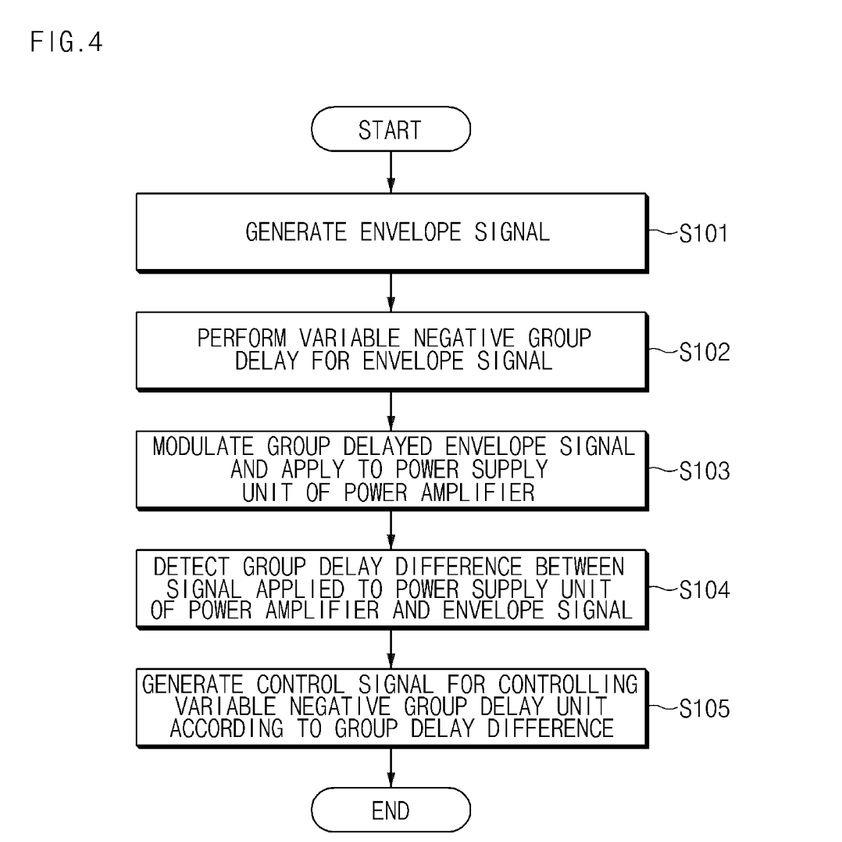
FIG. 4 is a flowchart illustrating a method for adjusting an envelope signal delay in an envelope-tracking power amplifier according to an embodiment of the present invention.

Hereinafter, a method for adjusting an envelope signal delay in an envelope-tracking power amplifier according to an embodiment of the present invention is described in detail with reference to the above described FIG. 2 and additionally with reference to FIG. 4.

First, when an envelope signal is provided from the envelope signal providing unit 110 (S101), the variable negative group delay unit 120 may perform a variable negative group delay for the envelope signal (S102). In this case, the envelope signal providing unit 110 may receive the envelope signal inputted from the modem 170 as shown in FIG. 2 or may extract and use the envelope signal by using the RF input signal inputted to the power amplifier 160 as shown in FIG. 3.

The variable negative group delay unit 120 may transmit the group delay adjusted-envelope signal to the envelope modulator 130, and the envelope modulator 130 may apply the group delay adjusted-envelope signal outputted from the variable negative group delay unit 120 to the power supply unit of the power amplifier 160 (S103).

Then, the group delay difference detecting unit 140 may detect a group delay difference between the envelope signal applied to the power supply unit of the power amplifier 160 and the envelope signal outputted from the envelope signal providing unit 110 (S104).

Then, the control signal generating unit 150 may output a control signal for compensating the group delay difference to the variable negative group delay unit 120 (S105). That is, the control signal generating unit 150 may generate a control signal for controlling the variable negative group delay unit 120 to adjust the group delay of the envelope signal in such a manner that the group delay difference error signal outputted from the group delay difference detecting unit 140 is compensated for a corresponding group delay difference.

Accordingly, by using the control signal outputted from the control signal generating unit 150, the variable negative group delay unit 120 may adjust the group delay difference between the envelope signal outputted from the envelope signal providing unit 110 and the envelope signal outputted from the envelope modulator 130. Next, since the adjusted envelope signal is inputted to the envelope modulator 130, the group delay difference between the envelope signal outputted from the envelope signal providing unit 110 and the envelope signal outputted from the envelope modulator 130 may be disappeared. Thus, an envelope signal having matched time synchronization may be provided to the power amplifier 160.

Figure 5A:
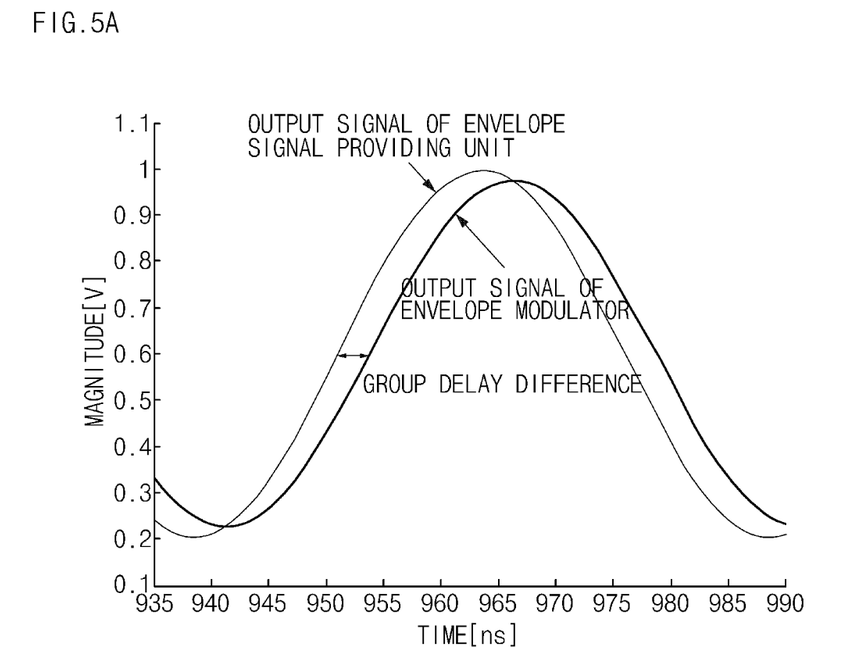
FIG. 5A is a graph simulating output waveforms of an output signal of an envelope signal providing unit and an output signal of an envelope modulator when a variable negative group delay unit according to the present invention is not used.

FIG. 5A is a graph simulating output waveforms of an envelope signal outputted from an envelope signal providing unit 110 and an envelope signal outputted from an envelope modulator 130, when a variable negative group delay unit 120 according to the present invention is not used.

Referring to FIG. 5A, a simulation may be accomplished on the condition that a sine wave having a 20 MHz frequency is used as the output signal of the envelope signal providing unit 110 and the envelope modulator 130 has a signal buffer (gain=1) having a bandwidth of 60 MHz. As shown in FIG. 5A, when the envelope is not group delay adjusted by using the variable negative group delay unit 120, it can be seen that a group delay difference between the envelope signal outputted from the envelope signal providing unit 110 and the envelope signal outputted from the envelope modulator 130 occurs.

That is, it can be seen that the group delay occurs about +2.5 ns in comparison with the input signal, due to the group delay characteristic of the envelope modulator 130. That is, it can be seen that the envelope signal outputted from the envelope modulator 130 is outputted with about +2.5 ns group delay, in comparison with the envelope signal inputted to the envelope modulator 130. In general, since the bandwidth of the envelope modulator 130 is not so broad, as described above, the envelope modulator 130 has a relatively large group delay characteristic.

Accordingly, due to the group delay characteristic of the envelope modulator, the group delay difference between the RF input signal of the envelope-tracking power amplifier and the output signal of the envelope modulator 130 applied to the power supply unit of the envelope-tracking power amplifier occurs significantly, the quality the output signal of the envelope-tracking power amplifier may be deteriorated and the linearity may be degraded.

Figure 5B:
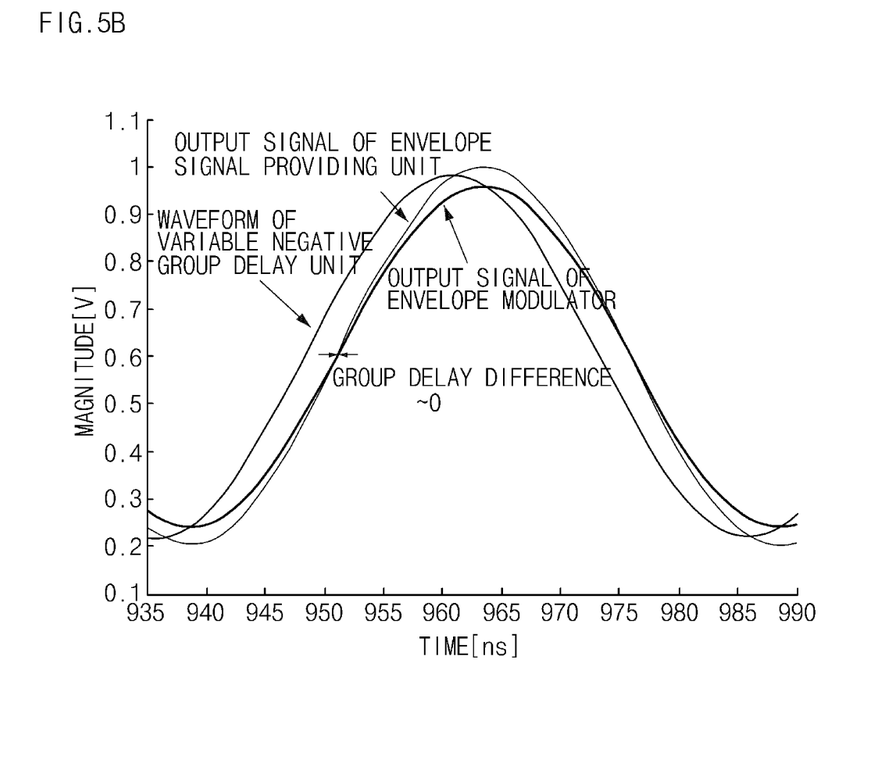
FIG. 5B is a graph simulating output waveforms of an output signal of an envelope signal providing unit and an output signal of an envelope modulator and an output waveform of a variable negative group delay unit when a variable negative group delay unit according to the present invention is used.

FIG. 5B is a graph simulating output waveforms of an envelope signal outputted from an envelope signal providing unit 110 and an envelope signal outputted from an envelope modulator 130 when a variable negative group delay unit 120 according to the present invention is used. Referring to FIG. 5B, on the same condition as FIG. 5A, a simulation may be accomplished on the condition that a sine wave having a 20 MHz frequency is used as the output signal of the envelope signal providing unit 110 and the envelope modulator 130 has a signal buffer (gain=1) having a bandwidth of 60 MHz.

As shown in FIG. 5B, as the envelope signal is group delay adjusted by using the variable negative group delay unit 120, it can be seen that the group delay difference between the envelope signal outputted from the envelope signal providing unit 110 and the envelope signal outputted from the envelope modulator 130 hardly exists.

That is, in comparison with the output signal of the envelope signal providing unit 110 inputted to the variable negative group delay unit 120, the output signal of the variable negative group delay unit 120 is group delayed earlier about 2.5 ns and is outputted. Since the group delay of the envelope signal outputted from the variable negative group delay unit 120 is earlier than the envelope signal inputted to the variable negative group delay unit 120, it can be seen that the negative group delay is occurred in the variable negative group delay unit 120.

The above described delay is a negative group delay to exactly compensate the +2.5 ns group delay generated in the envelope modulator 130. The envelope signal, which is group delayed −2.5 ns by the variable negative group delay unit 120, is inputted to the envelope modulator 130 such that the envelope signal, which is group delayed 0 ns from the signal outputted from the envelope modulator 130, is outputted finally. As shown in FIG. 5B, it can be seen that the group delay difference between the envelope signal outputted from the envelope signal providing unit 110 and the envelope signal outputted from the envelope modulator 130 hardly exists.

Accordingly, since the group delay difference between the envelope signal outputted from the envelope signal providing unit 110 and the envelope signal outputted from the envelope modulator 130 is approximately zero, the group delay difference between the RF input signal of the envelope-tracking power amplifier and the envelope signal applied to the power supply unit of the envelope-tracking power amplifier becomes very small, so that the deterioration of the quality of the output signal of the envelope-tracking power amplifier may be prevented and the non-linearity may be decreased.

Thus, the present invention may adjust the group delay of the envelope signal applied to the power supply unit of the envelope-tracking power amplifier, so that the time synchronization between the RF input signal inputted to the envelope-tracking power amplifier and the envelope signal applied to the power supply unit of the envelope-tracking power amplifier is matched, thereby maximizing the characteristic of the adjacent channel leakage ratio (ACLR).

Figure 6:
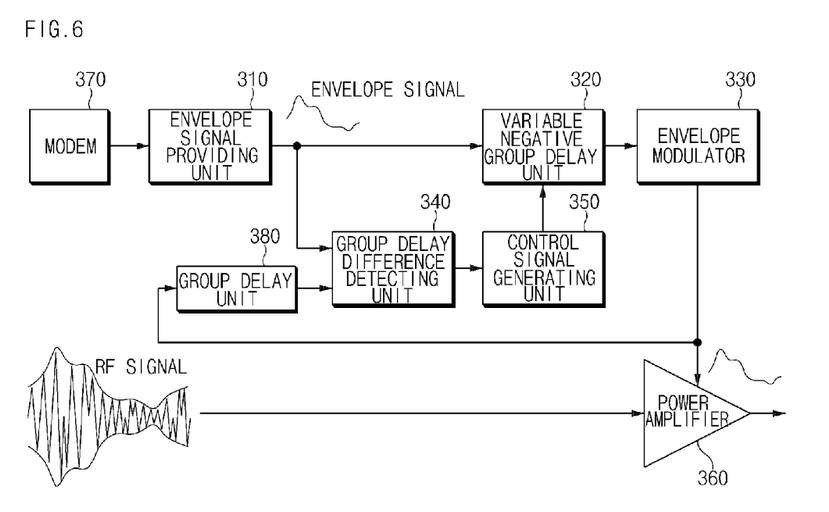
FIG. 6 is a diagram illustrating a configuration of an apparatus for adjusting an envelope signal delay in an envelope-tracking power amplifier according to a third embodiment of the present invention.

FIG. 6 is a diagram illustrating a configuration of an apparatus for adjusting an envelope signal delay in an envelope-tracking power amplifier according to a third embodiment of the present invention.

The apparatus for adjusting an envelope signal delay in an envelope-tracking power amplifier according to the third embodiment of the present invention is configured by adding a group delay unit 380 to the configuration of the first embodiment of the present invention.

That is, since a modem 370, an envelope signal providing unit 310, a variable negative group delay unit 320, an envelope modulator 330, a group delay difference detecting unit 340, a control signal generating unit 350, and a power amplifier 360 of the apparatus for adjusting an envelope signal delay in an envelope-tracking power amplifier according to the third embodiment of the present invention are identical with the modem 170, the envelope signal providing unit 110, the variable negative group delay unit 120, the envelope modulator 130, the group delay difference detecting unit 140, the control signal generating unit 150, and the power amplifier 160 of the first embodiment of the present invention, a detailed description thereof is omitted.

The group delay unit 380 according to the third embodiment of the present invention may be provided between the envelope modulator 330 and the group delay difference detecting unit 340. The group delay unit 380 may group-delay the envelope signal which is outputted from the envelope modulator 330 and apply the group-delayed envelope signal to the group delay difference detecting unit 340.

According to the first embodiment of the present invention, the group delay difference between the output signal of the envelope modulator 130 and the output signal of the envelope signal providing unit 110 hardly exists due to the variable negative group delay unit 120, but practically, a group delay may occur due to environmental physical conditions. Accordingly, the third embodiment of the present invention may add the group delay unit 380, and the group delay unit 380 may group delay the envelope signal outputted from the envelope modulator 330 to a preset extent, and transmit the group delayed signal to the group delay difference detecting unit 340.

Thus, the group delay difference detecting unit 340 may generate an error signal corresponding to the delay difference between the envelope signal outputted by the envelope signal providing unit 110 and the envelope signal which is delayed by the group delay unit 380. Accordingly, the variable negative group delay unit 320 may group delay the group delay difference between the envelope signal outputted from the envelope signal providing unit 110 and the envelope signal which passed the group delay unit 380, and output to the envelope modulator 330.

Accordingly, a negative group delay, accomplished by the group delay unit 380, may exist between the envelope signal outputted from the envelope signal providing unit 110 and the envelope signal outputted from the envelope modulator 330.

Figure 7:
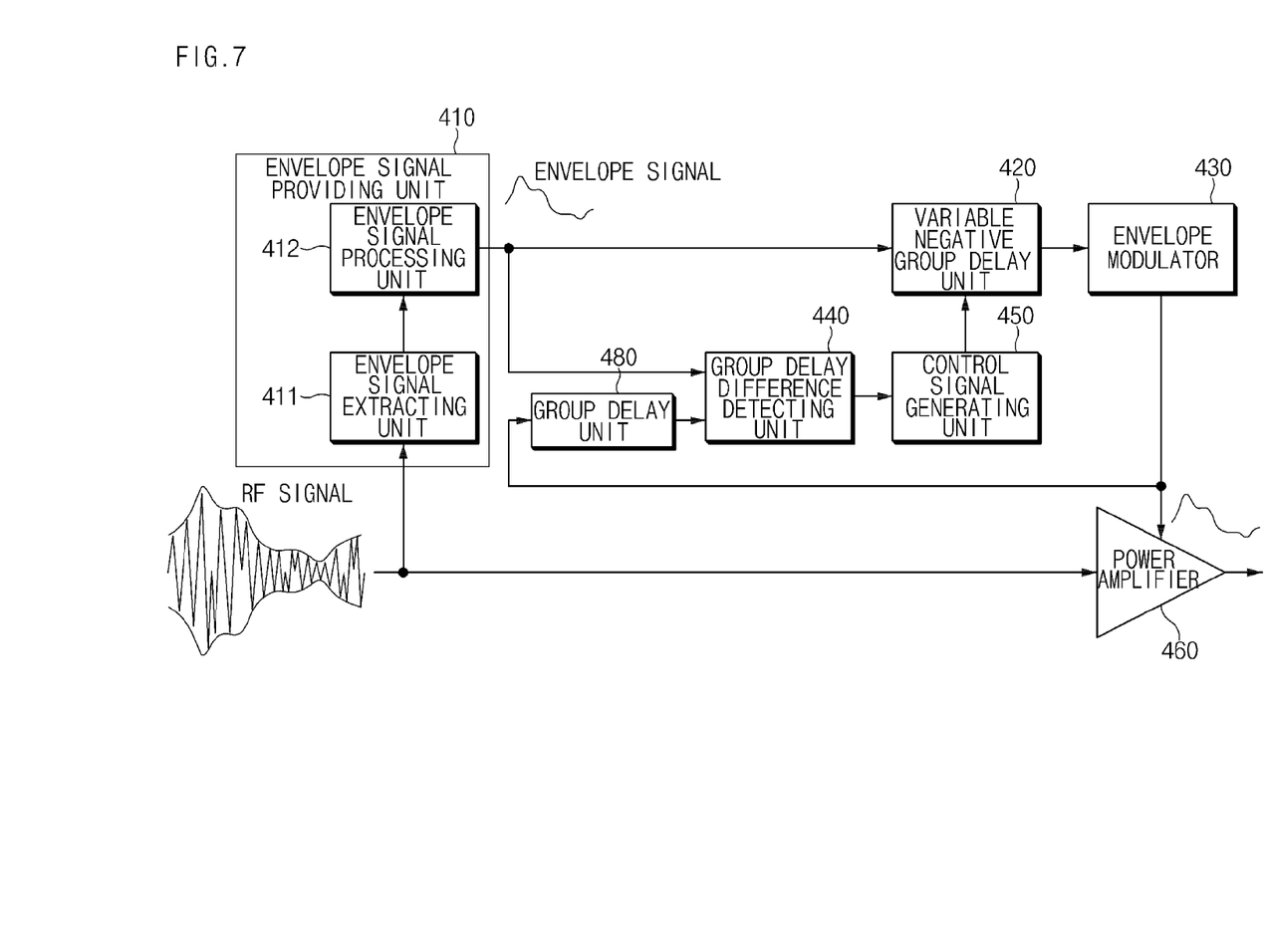
FIG. 7 is a diagram illustrating a configuration of an apparatus for adjusting an envelope signal delay in an envelope-tracking power amplifier according to a fourth embodiment of the present invention.

FIG. 7 is a diagram illustrating a configuration of an apparatus for adjusting an envelope signal delay in an envelope-tracking power amplifier according to a fourth embodiment of the present invention.

The apparatus for adjusting an envelope signal delay in an envelope-tracking power amplifier according to the fourth embodiment of the present invention is configured by adding a group delay unit 480 to the configuration of the second embodiment of the present invention.

That is, since an envelope signal providing unit 410, a variable negative group delay unit 420, an envelope modulator 430, a group delay difference detecting unit 440, a control signal generating unit 450, and a power amplifier 460 of the apparatus for adjusting an envelope signal delay in an envelope-tracking power amplifier according to the fourth embodiment of the present invention are identical with the envelope signal providing unit 210, the variable negative group delay unit 220, the envelope modulator 230, the group delay difference detecting unit 240, the control signal generating unit 250, and the power amplifier 260 of the second embodiment of the present invention, a detailed description thereof is omitted.

The group delay unit 480 according to the fourth embodiment of the present invention may be provided between the envelope modulator 430 and the group delay difference detecting unit 440. The group delay unit 480 may group-delay the envelope signal which is outputted from the envelope modulator 430 and apply the group-delayed envelope signal to the group delay difference detecting unit 440.

The group delay unit 480 of the fourth embodiment of the present invention may perform the same function as the group delay unit 380 of FIG. 6.

Figure 8A:
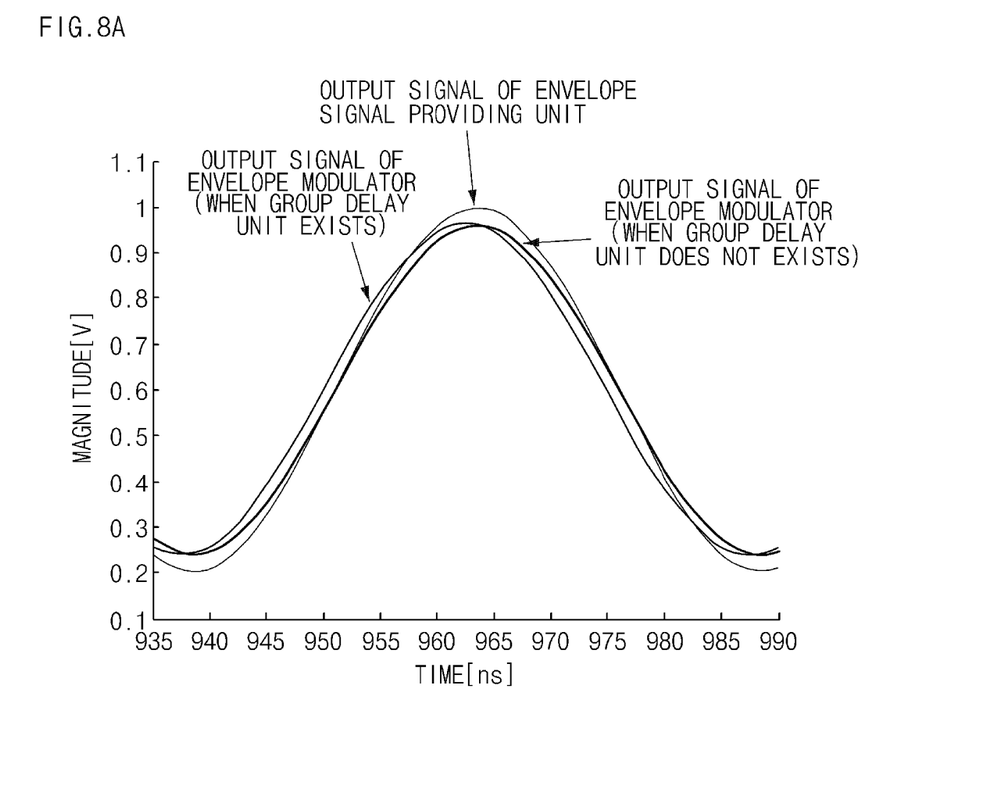
FIG. 8A is a waveform graph illustrating a group delay when the group delay unit of FIG. 6 and FIG. 7 does not exist.
Figure 8B:
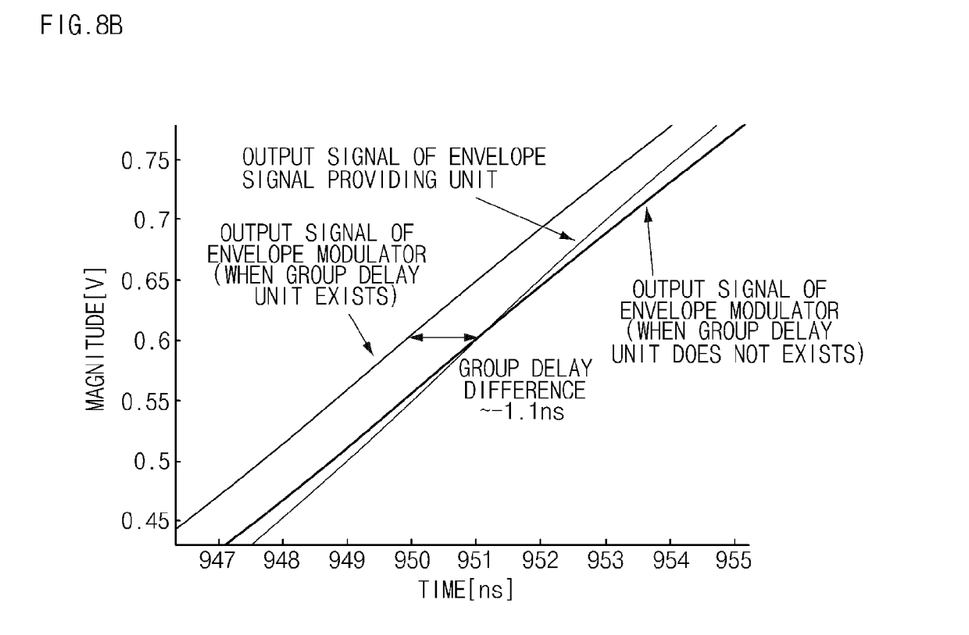
FIG. 8B is a waveform graph illustrating a group delay when the group delay unit of FIG. 6 and FIG. 7 exists.

FIG. 8A is a waveform graph illustrating a group delay when the group delay units 380 and 480 of FIG. 6 and FIG. 7 does not exist, and FIG. 8B is a waveform graph illustrating a group delay when the group delay units of FIG. 6 and FIG. 7 are provided. FIG. 8A and FIG. 8B are an envelope signal which is outputted from the envelope signal providing units 310 and 410, and it is assumed that a sine wave having a 20 MHz frequency is used and the envelope modulators 330 and 430 have a signal buffer (gain=1) having a bandwidth of 60 MHz.

Referring to FIG. 8A, similarly to FIG. 5B, the group delay hardly exists between the envelope signal outputted from the envelope signal providing units 310 and 410 and the envelope signal outputted from the envelope modulators 330 and 430.

Referring to FIG. 8B, the envelope signal, which is delayed 1.1 ns in comparison with the envelope signal which is outputted from the envelope modulators 330 and 430, due to the group delay of about +1.1 ns generated by the group delay units 380 and 480, is inputted to the group delay difference detecting units 340 and 440. Thus, the control signal generating unit 350 and 450 may control the value of the negative group delay of the variable negative group delay unit 320 and 420 to be increased.

Accordingly, the envelope signal, which is additionally negative group delayed in the variable negative group delay units 320 and 420 due to the group delay units 380 and 480, may be outputted as a signal which is earlier (i.e., the negative group delay) about 1.1 ns in comparison with the envelope signal outputted from the envelope signal providing unit, when being outputted to the power amplifiers 360 and 460 via the envelope modulators 330 and 430.

As described above, the apparatus and the method for adjusting an envelope signal delay in an envelope-tracking power amplifier according to the embodiment of the present invention may minimize a difference of time delay between the input signal of the power amplifier and the envelope signal applied to the power supply unit of the power amplifier, thereby preventing the deterioration of the output signal of the power amplifier which is generated due to a time delay between the two signals.

Further, the present invention may minimize a difference of time delay between the input signal of the power amplifier and the envelope signal applied to the power supply unit of the power amplifier, thereby maintaining the adjacent channel leakage ratio in the output of the envelope-tracking power amplifier to be able to accomplish a wireless transmission of a signal.

In addition, the present invention may compensate a group delay due to the group delay unit to always maintain a constant performance even in the case of the change of the surrounding environment and the change caused by the difference in performance between chips.

Although exemplary embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims.

What is claimed is:

1. An apparatus for adjusting an envelope signal delay in an envelope-tracking power amplifier, the apparatus comprising:
   an envelope signal providing unit configured to provide an envelope signal;
   a variable negative group delay unit configured to adjust a group delay of the envelope signal received from the envelope signal providing unit and output the adjusted envelope signal;
   an envelope modulator configured to modulate the adjusted envelope signal outputted from the variable negative group delay unit;
   a group delay difference detecting unit configured to detect a group delay difference between the envelope signal which is outputted from the envelope signal providing unit and the envelope signal which is outputted from the envelope modulator; and
   a control signal generating unit configured to generate a control signal to control a group delay value of the variable negative group delay unit according to the group delay difference.

2. The apparatus of claim 1, further comprising a power amplifier configured to amplify a power of an input signal, when the envelope signal which is outputted from the envelope modulator is applied to a power supply unit of the power amplifier.

3. The apparatus of claim 2, wherein the envelope signal providing unit comprises:
   an extracting unit configured to extract an envelope signal from all or part of the input signal which is inputted to the power amplifier; and
   an envelope signal processing unit configured to process the extracted envelope signal.

4. The apparatus of claim 2, wherein the variable negative group delay unit performs a group delay for the envelope signal outputted from the envelope signal providing unit so that time synchronization between the envelope signal which is outputted from the envelope modulator and the input signal is matched.

5. The apparatus of claim 2, wherein the variable negative group delay unit performs a group delay for the envelope signal which is outputted from the envelope signal providing unit in order to compensate a time difference between the envelope signal which is outputted from the envelope signal providing unit and the envelope signal which is outputted from the envelope modulator.

6. The apparatus of claim 1, further comprising a modem configured to transmit the envelope signal.

7. The apparatus of claim 1, further comprising a group delay unit configured to perform a group delay for the envelope signal which is outputted from the envelope modulator to transmit to the group delay difference detecting unit.

8. A method for adjusting an envelope signal delay in an envelope-tracking power amplifier, the method comprising:
   providing an envelope signal;
   performing a variable negative group delay for the envelope signal;
   modulating the group delayed envelope signal and applying to a power supply unit of a power amplifier configured to amplify a power of an input signal;
   detecting a group delay difference between the signal applied to the power supply unit of the power amplifier and the envelope signal; and
   performing the variable negative group delay for the envelope signal according to the group delay difference.

9. The method of claim 8, wherein providing an envelope signal comprises extracting and processing all or part of the input signal and providing the envelope signal.

10. The method of claim 8, wherein providing an envelope signal comprises generating an envelope signal by a modem.

11. The method of claim 8, before detecting a group delay difference, further comprising performing a group delay for the signal which is applied to the power supply unit of the power amplifier.

12. The method of claim 8, wherein performing a variable negative group delay comprises performing the variable negative group delay for the envelope signal so that time synchronization between the signal which is applied to the power supply unit of the power amplifier and the input signal which is inputted to the power amplifier is matched.

* * * * *